United States Patent
El-Kik et al.

(10) Patent No.: US 6,427,216 B1
(45) Date of Patent: Jul. 30, 2002

(54) INTEGRATED CIRCUIT TESTING USING A HIGH SPEED DATA INTERFACE BUS

(75) Inventors: Tony S. El-Kik, Lehigh; Jeffrey P. Grundvig, Macungie, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/265,932

(22) Filed: Mar. 11, 1999

(51) Int. Cl.$^7$ ............................................. G06F 11/00
(52) U.S. Cl. .................................... 714/726; 714/724
(58) Field of Search ............................ 714/726, 724, 714/30, 31, 27

(56) References Cited

U.S. PATENT DOCUMENTS 5,355,369 A    10/1994  Greenberger et al. ...... 371/22.3
5,668,815 A  * 9/1997  Gittinger et al. ............ 714/719
5,682,391 A    10/1997  Narayanan .................. 371/22.3

* cited by examiner

Primary Examiner—Phung M. Chung
(74) Attorney, Agent, or Firm—Synnestvedt & Lechner LLP

(57) ABSTRACT

The use of a JTAG port for boundary scan testing of integrated circuits, (IC) thereby allowing for the testing of the IC's after they have been mounted onto a circuit board. The present invention speeds the testing of integrated circuitry by introducing an external memory where all the test vectors are stored. This external memory is connected to the digital processor core by a high speed interface extended memory interface (EMI). The test vectors are uploaded into the digital processor core from the external memory via the high speed EMI interface.

19 Claims, 5 Drawing Sheets

INTEGRATED CIRCUIT TESTING USING A HIGH SPEED DATA INTERFACE BUS

FIELD OF THE INVENTION

The present invention relates to testing of integrated circuits. In particular, the invention relates to testing of integrated circuits involving downloading test vectors via a high speed data interface.

DESCRIPTION OF THE PRIOR ART

The development of complex integrated circuits increasingly depends upon the ability to test the circuitry sufficiently to ensure proper operation. This is becoming increasingly difficult as the number of logic gates in a given integrated circuit increases. To test these logic gates, the number of input test data (referred to as "test vectors") also must increase so that all possible input states, or at least a significant portion of them, are included in the test program. Traditionally, integrated circuits have been tested for functionality in the factory on a commercial test machine. Either the wafer is probed or the packaged part is tested. A sequence of test vectors is applied in parallel to the input pads or pins and comparisons with expected results are performed on the output pads or pins. The fault coverage is usually less than 100% and is dependent on how many test vectors there are, how well the test vectors were written, and the degree of complexity of the circuitry to be tested.

The problems with this prior-art testing scheme include the fact that commercial test sets (e.g., Automated Test Equipment) have difficulty working fast enough to test high speed parts. Also, the only way to test the packages once they have been soldered onto boards is to test them with a custom "bed of nails" that disables other packaged chips on the board and applies test vectors to the package under test. This is becoming increasingly difficult as printed circuit boards with surface mount packages on both sides are becoming more common. Even further, it is not possible to test a package in the field or even in the factory when the printed circuit board on which it is embodied is plugged into its slot. For instance, in an application specific integrated circuit (ASIC) methodology, a core processor can be embedded in a design such that a vector set cannot be applied at the bond pads.

Many have advocated dealing with these test problems by adding Built In Self Test (BIST) circuitry on a chip. Here, a signal applied to the chip causes the BIST circuitry to perform a test. Typically, there is a pseudo-random sequence produced by a shift register with feedback. The sequence is applied to the circuitry under test and the outputs from the circuitry are compressed and compared with an expected signature. BIST has been used successfully in a number of chips. However, it too has drawbacks, including: while BIST solutions are known for regular structures such as memories, there is no general way known to produce BIST circuitry for arbitrary random logic with high fault coverage. In addition, BIST requires adding area overhead to the chip.

A recent development in integrated circuit testing is the use of the JTAG (Joint Test Action Group) test port for on site testing of an IC mounted on a board. This standard has been adopted by the Institute of Electrical and Electronics Engineers, Inc., as IEEE Standard 1149.1, IEEE Standard Test Access Port and Boundary-Scan Architecture, which is incorporated herein by reference. An overview of the development, definition, and application of this standard is provided in Test Access Port and Boundary-Scan Architecture, C. M. Maunder and R. E. Tulloss, published by the IEEE Computer Society Press, Los Alamitos, Calif. (1990).

FIG. 3 illustrates a block diagram of the components used in a typical JTAG testing scheme. As shown in FIG. 1, in a typical JTAG scheme, a Test Access Port (TAP) is added to each chip or grouping of chips on a board. The TAP includes three inputs: test clock (TCK), test mode select (TMS), and test data in (TDI). In addition, there is one output, test data output (TDO). TDI and TDO are daisy-chained from chip to chip, whereas TCK and TMS are broadcast to each chip in a group.

As shown in FIG. 3, every JTAG chip contains a boundary scan register 300, and a bypass register 301. The boundary scan register 300 serially shifts any desired data pattern from the TDI port into the input stages of the chip. The boundary scan register 300 receives input from the input terminals $I_1$, ... $I_3$. It also receives system clock terminal CK1. All the inputs are received via TDI port. The boundary scan register generates the chip outputs over JI, ... $JI_3$ lines. All the outputs are shifted out of the chip via TDO port of the chip. Other lines not shown, are used to send signals in the other direction, (i.e., from the chip output circuitry to the chip output terminals.) Each chip also contains a TAP controller 302 that implements a standard state machine steered by the signal applied at the TMS terminal. In this regard, the TAP controller 302 selects one of sixteen states for shifting data and instructions into the registers, among other functions. The instruction register 303 allows test instructions to be entered into each chip, and the instruction decoder 304 serves to decode the instructions. The output of a given register is selected by multiplexers 307 and 308, and driven off-chip by the output buffer 309, which supplies the TDO signal. The external signals applied to the JTAG test access port are provided by a master controller, usually referred to as the "JTAG master".

The JTAG standard allows a chip to have arbitrary data serially scanned into its boundary scan register 300. This arbitrary data may be an input test vector or an output test result. The JTAG standard also supports tri-stating outputs. A standard scheme allows opens and shorts on the board or bond wires to be located. A chip can be tested by applying its entire factory vector set serially through the boundary scan register 300.

The JTAG standard also allows for optional registers to be added. For example, a manufacturer's identification register 305 provides a unique code identifying the chip type. In addition, a user test register 306 may be defined, typically to provide support for triggering BIST and reading the test status results.

A problem with this JTAG testing scheme is that testing of the chip by serial scanning wherein one bit is serially scanned at a time is very slow, and time consuming.

FIGS. 4A and 4B illustrate another JTAG based testing scheme. A full description of this scheme may be found in U.S. Pat. No. 5,355,369 issued on Oct. 11, 1994 to Greenbergerl Alan J. et al., which is incorporated herein by reference.

In this scheme, most components are similar to FIG. 1, but two additional data registers, TDR 11 and JCON 10 are used to download the test vectors to the logic circuitry under test, and upload the results. Both TDR 11 and JCON 10 are compatible with the JTAG standard. TDR 11 is a serial shift register which is parallel readable and writeable by the digital processor core. JCON 10 is a serial scan register with parallel outputs on the chip. JCON 10 contains additional signals to provide flexibility in clocking the digital processor test program while it is in a board environment.

In this scheme, the board containing the digital processor normally provides a system clock to a clock terminal. If this clock is available and free running on the board, the JTAG may select it as the source of chip clock and begin testing. This allows the tests to be run at normal chip operational speed. The older JTAG schemes do not have JCON 10 and do not have flexibility to select a free running board clock, and the testing is very slow. The speed of this clock is dependent on system implementation.

This testing scheme has improved performance as it allows for testing the integrated circuit at full operational speed. But, the overall testing (including downloading of the test vectors) of the chip is very slow. Even though there are 16 bits in a cycle, only one bit of the test vectors is scanned and downloaded at a time. Thus, the downloading of test vectors into the chip takes a very long time, thereby slowing the whole testing process. Thus, many of the traditional methods of testing the digital processor involve downloading test programs serially through a slow test port into internal memory located on the digital processor device, and then resetting the digital processor device and executing the test programs starting from location zero inside the internal memory. The downloading is done serially which in turn increases the testing time and the cost of manufacturing the device.

Thus, there exists a need for an apparatus and a scheme for downloading test vectors at a higher speed thereby reducing the time for testing integrated circuits.

SUMMARY OF THE INVENTION

According to the principles of the present invention, a method and an apparatus for testing an integrated circuit by the use of a high speed data interface bus is provided. In the present invention, an integrated circuit having a programmable digital processor, a program (internal) memory, and a JTAG driver is coupled to an external memory via a high speed (parallel) interface bus. The external memory stores a plurality of test vectors to be used for testing operation of the integrated circuit, and the high speed interface bus is used to download these test vectors. The JTAG circuit is used to download the control program controlling the download of the test vectors.

In the inventive method, first, a control program (executable code) is downloaded through the JTAG port into an internal (program) memory. This control program then downloads the test vectors (which are stored in an external memory) into the internal memory at location 0x0 using the high speed data bus. Once the downloading is finished, the digital processor device resets and the test vectors start verifying the functionality of the digital processor and/or the peripheral circuits.

The proposed method and apparatus reduces the testing time by almost 50% because only a short program (control program) is downloaded via the slow serial port. The actual test programs are downloaded via a high speed interface bus, for example, a high speed external memory interface.

DETAILED DESCRIPTION OF THE PREFERRED EMBODIMENT

Figure 1:
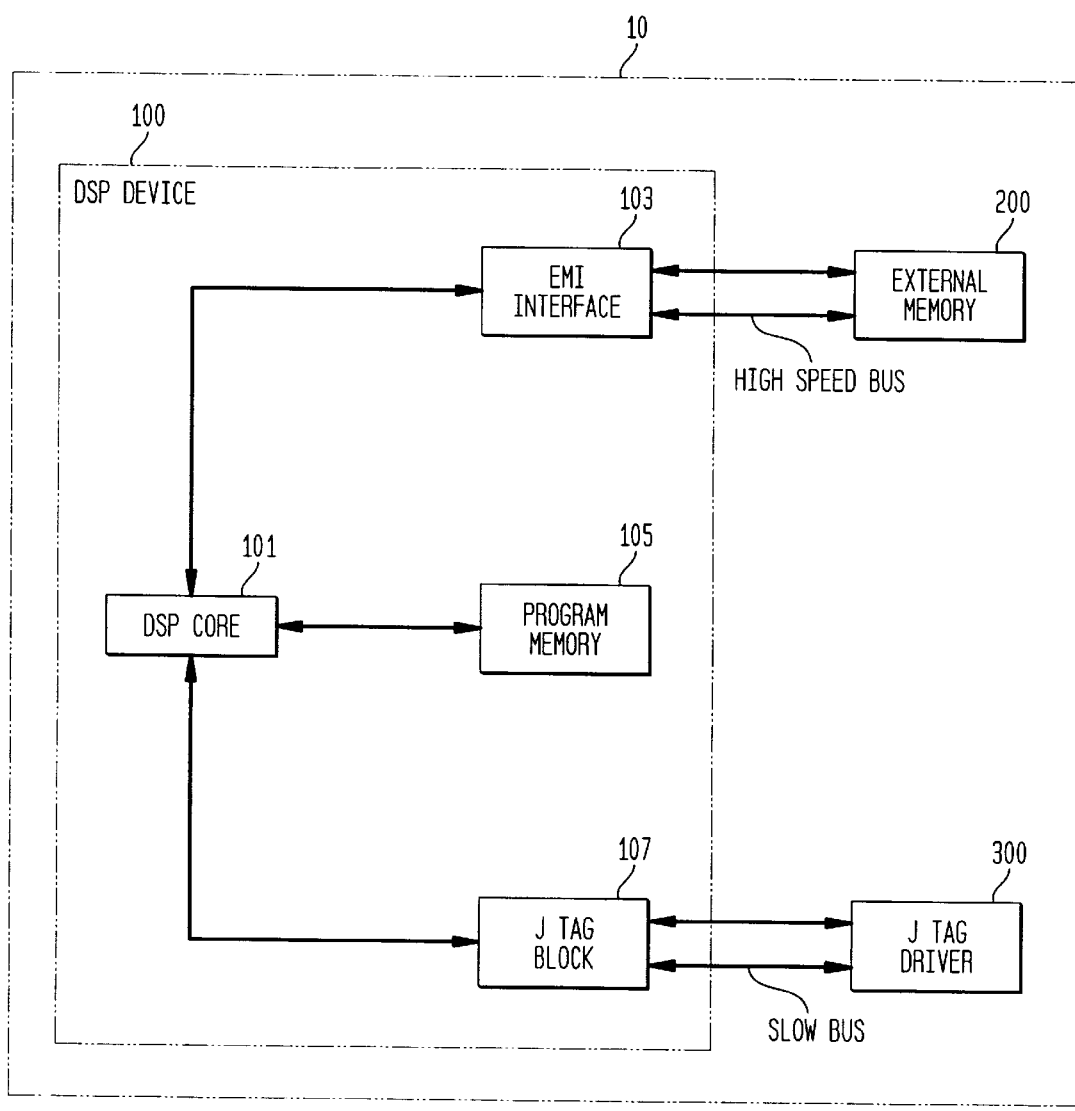
FIG. 1 illustrates an implementation of a preferred embodiment of the present invention.

FIG. 1 is a block diagram illustrating a preferred embodiment of the present invention.

In the preferred embodiment, the present invention 10 comprises a device 100, an external memory 200 and a JTAG driver 300. The device 100 is the integrated chip desired to be tested and typically includes a programmable digital signal processor (DSP) or microcomputer wherein an arithmetic logic unit (ALU) resides on the same chip as the program memory.

The JTAG driver 300 is a driver/monitor module. The external memory 200 is a memory register capable of storing data. The DSP device 100 is connected to the external memory 200 and the JTAG driver 300 bi-directionally.

The DSP device 100 comprises a programmable DSP core 101 (herein DSP core 101 ), a dual port memory 105 (termed program memory), a JTAG block 107, and an external memory interface (EMI) 103. The DSP core 101 is the processor core for the DSP device 100. The JTAG block 107 is the JTAG interface required for data communication between the DSP device 100 and the JTAG driver 300. EMI interface 103 is a extended external memory interface used to connect a DSP to an external memory and input/output devices. The EMI interface 103 is a high speed data interface capable of downloading 16 bits in parallel. The DSP core 101 is coupled to an external memory 200 by the EMI 103. The DSP core is coupled to the JTAG driver 300 via the JTAG block 107.

The test vectors used to test the DSP device 100 are stored in the external memory 200, and a small source code capable of controlling the download of test vectors is stored in the JTAG driver 300.

Figure 3:
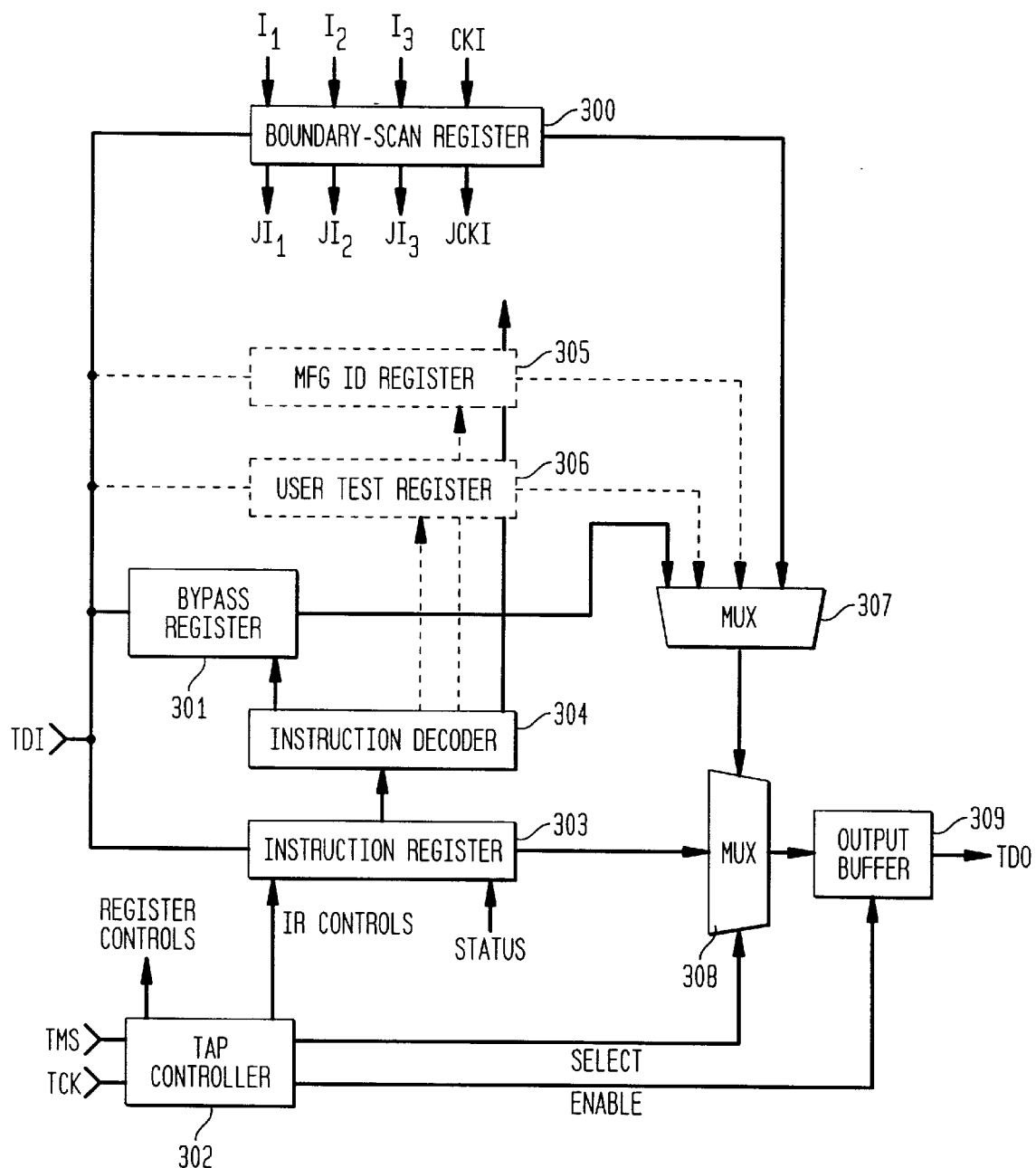
FIG. 3 illustrates a prior art JTAG technique.

To facilitate testing of the DSP device 100, first, a small code (termed executable code) is downloaded from the JTAG driver 300 to the DSP core 101 via the JTAG block 107. This executable code is then stored in the program memory 105. This executable code sends the control signals to the DSP core 101 indicating that the actual test vectors should be downloaded from the external memory 200 to the program memory 105 via the EMI interface 103. The test vectors are then downloaded from the external memory 200 to the DSP device 100. Once the downloading is completed, the DSP device 100 is reset and the test vectors start verifying the functionality of the DSP core 101 or any of the peripheral blocks (not shown in FIG. 3). When testing is completed, the results are output from the DSP core 101 to the JTAG driver 300 via the JTAG block 107.

Thus, there is bidirectional communication between the JTAG driver 300 and the DSP device 100. That is, operational code is downloaded from the JTAG driver 300 to the DSP device (via the JTAG block 107), and the test results are output from the DSP device 100 to the JTAG driver 300 (via the JTAG block 107).

JTAG block 107 is a serial scan interface capable of serially shifting one bit at a time, whereas EMI interface 103 is a high speed interface capable of shifting sixteen bits in parallel at a time.

In prior art schemes, the test vectors are downloaded completely through the JTAG block 107. In the present invention, the executable code is downloaded through the JTAG block 107. Then, by executing the executable code, the actual test vectors are downloaded from external memory 200 through the high speed EMI interface 103.

Thus, in the present invention, the speed of the downloading process (downloading of test vectors) is dramatically increased, thereby reducing the testing time of an integrated circuit which results in great cost savings.

Figure 2:
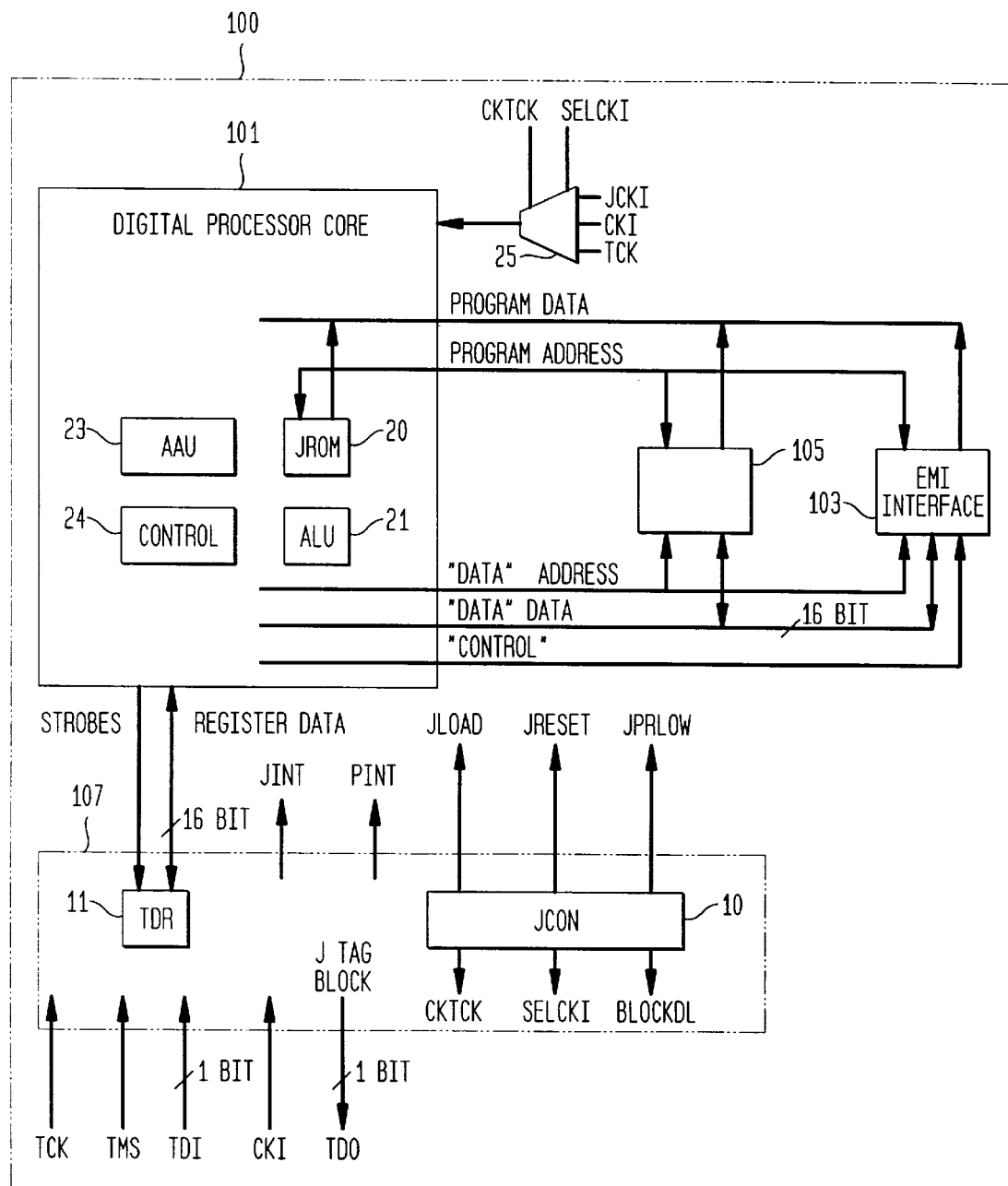
FIG. 2 illustrates a block diagram illustrating the various components of the DSP device of FIG. 3.

FIG. 2 is a block diagram illustrating the various components of the DSP device 100 of FIG. 1 in more detail.

As shown in FIG. 2, the digital processor core 101 (programmable) comprises an arithmetic logic unit (ALU) 21, an arithmetic address unit (AAU) 23, and a controller 24. The DSP core 101 also has a read-only memory, termed JROM 20 which controls the downloading of executable code into the program memory 105. JROM 20 stores the control instructions controlling the downloading of the executable code from the JTAG driver 300 to the DSP device 100. The illustrative digital processor core 101 utilizes well-known "harvard" architectures and has separate address and data buses for "control" and "data/information", respectively. These buses communicate with the ALU 21, the arithmetic address unit AAU 23, and the controller 24. Both buses are connected to the dual port program memory 105.

The digital processor core 101 is connected to a multiplexer 25 which provides the clock to the digital processor core 101. The multiplexer 25 has two control signals termed CKTCK and SELCKI. It provides a signal from one of the following clocks: TCK (The JTAG test clock), CKI (the system clock used in normal operation) or JCKI (the scanned system clock).

Figure 4A:
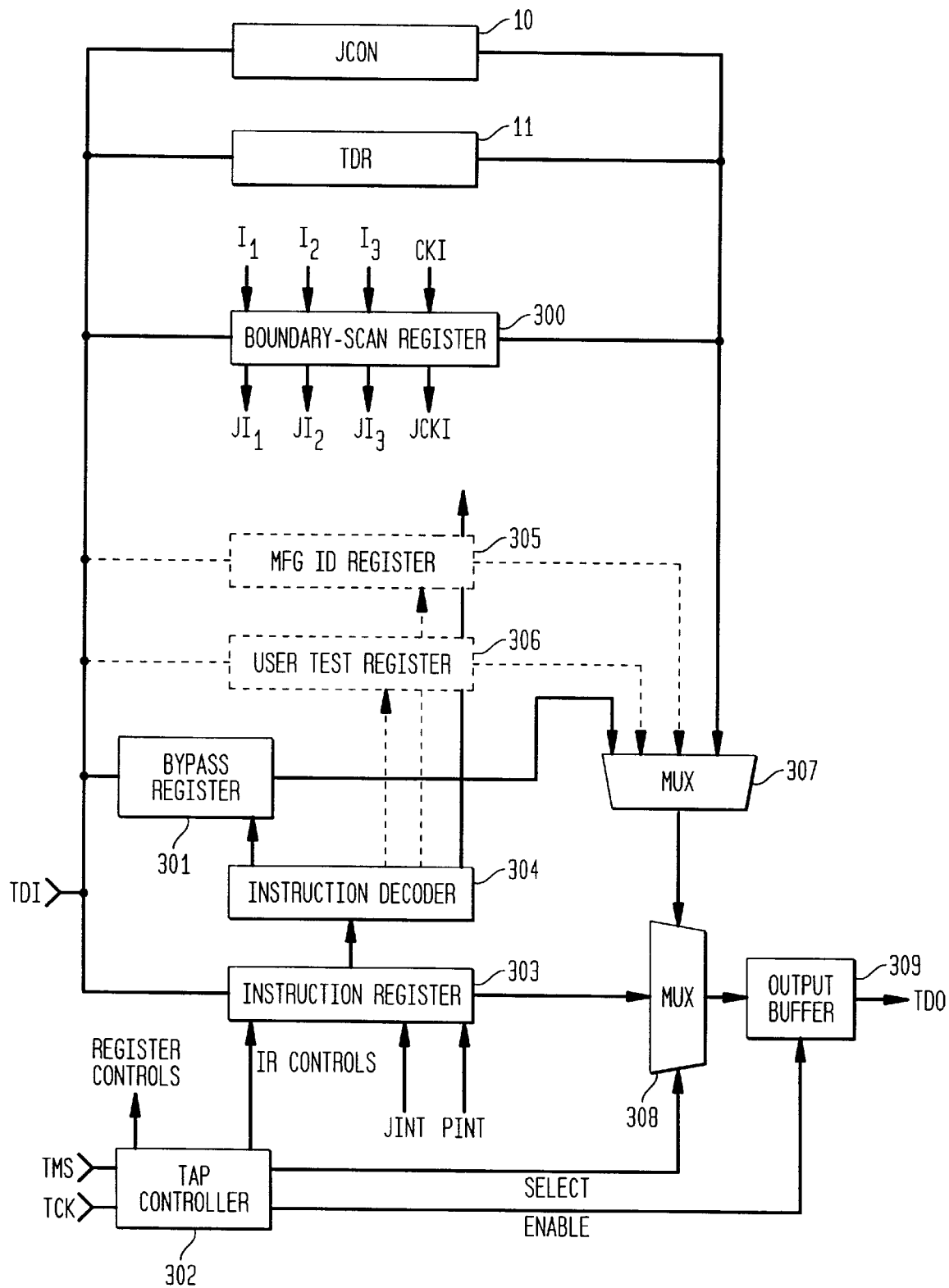
FIGS. 4A & 4B illustrate another prior art JTAG technique.
Figure 4B:
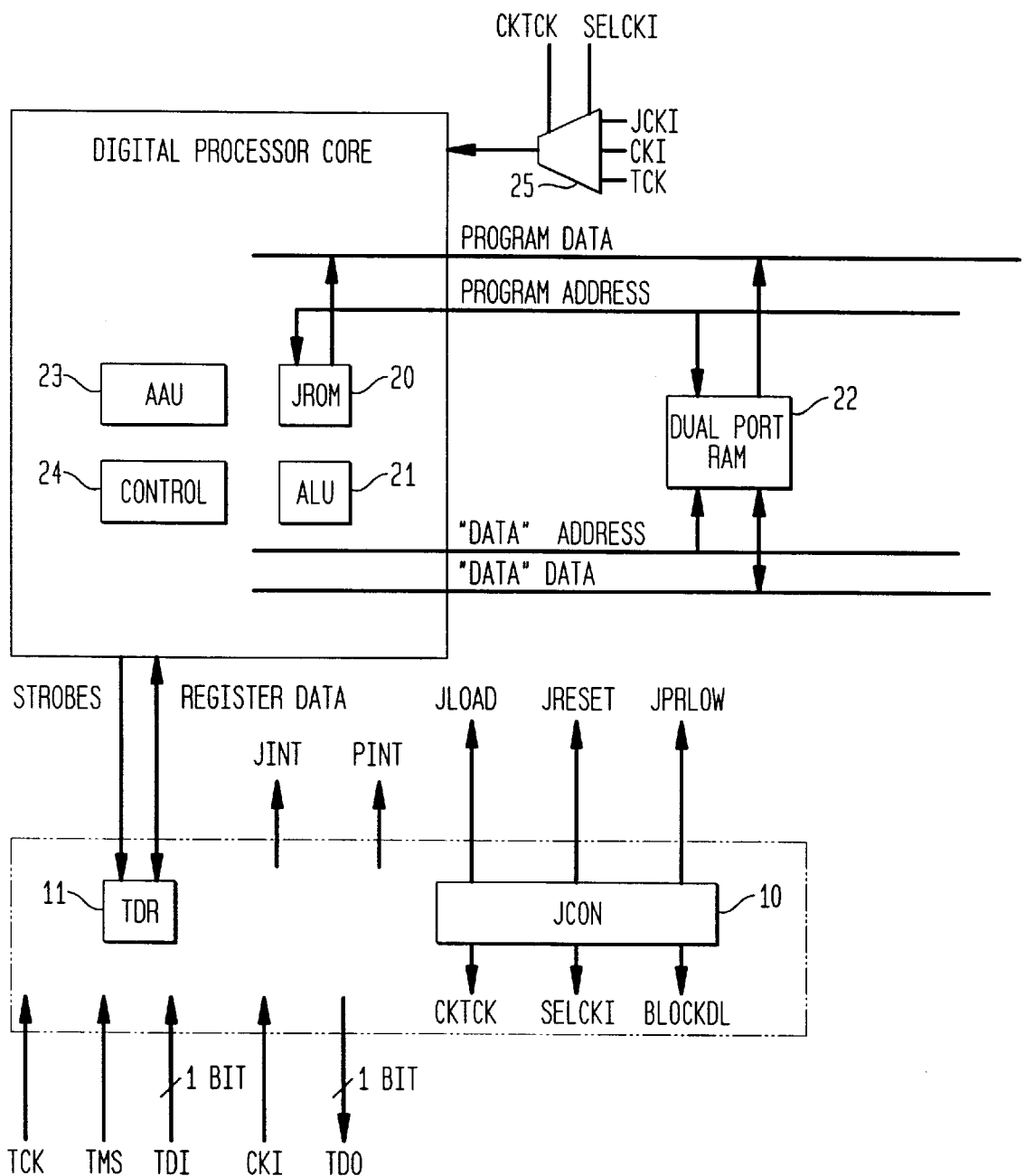

The program memory 105 is coupled to the digital processor core 101 by the "control" and "data" fuses. Both DSP core 101 and the program memory 105 are connected to the EMI interface 103 via the "control and "data" buses. The EMI interface 103 enables the DSP core 101 and the program memory 105 to communicate with the external memory 200 (not shown in FIG. 4).

The JTAG block 107 comprises two registers—TDR 11 and JCON 10. Both TDR 11 and JCON 10 are used to download the executable code to the DSP device 100 (logic circuitry under test), and upload the results. Both TDR 11 and JCON 10 are compatible with the JTAG standard. TDR 11 is a serial shift register which is parallel readable and writeable by the digital processor core 101. The number of bit locations in the TDR 11 is typically equal to the width of the program memory, being 16 bits in the illustrative embodiment. The JCON 10 also is a serial shift register. JCON 10 provides flexibility in clocking the test program when the digital processor is in a board environment.

Both JCON 10 and TDR 11 appear on the JTAG block 107 as serial scan registers, and JCON 10 has a parallel output on the chip. Six of its bits are used for downloading the executable code. These bits are:

| Signal | Function |
|---|---|
| JRSESET | Reset digital processor core |
| BLOCKDL | Enable block downloading |
| JLOAD | Map JROM 20 to program space for downloading |
| JPRLOW | Map program memory 105 starting at location 0 |
| SELCKI | Clock from bond pad instead of boundary scan register |
| CK TCK | Use TCK bond pad for clock instead of CKI |

A Test Access Port (TAP), not shown in FIG. 2, also exists in the JTAG block 107. The TAP includes three inputs: a test clock (TCK), test mode select (TMS), and test data in (TDI). In addition, there is one output, test data output (TDO). In the preferred embodiment, TDI and TDO are daisy-chained from chip to chip, whereas TCK and TMS are broadcast to each chip in a group.

The TDR 11 provides a half duplex channel for passing the words of information between the JTAG driver 300 and the digital processor core 101. As noted above, the words are 16 bits in the illustrative case, but could be any desired length that is suitable for use with the given digital processor core 101 and program memory 105.

In order to facilitate communication, there are two status flags to signal that data has been written or read: JINT is set when the JTAG driver 300 writes a word and is reset when the digital processor core 101 reads a word. PINT is set when JTAG driver 300 reads a word and is reset when the digital processor core 101 writes word. JINT is tied to an interrupt input and also a flag condition input of the digital processor core 101. PINT is tied to a flag condition input of the digital processor core. Hence, the JTAG driver 300 and the digital processor core 101 can both sense when words have been written or read.

By using the JTAG TAP signals (TCK, TMS, TDI), the following exemplary assembly language program (executable code) may be downloaded from the JTAG driver 300 into the TDR 11. The downloading mechanism is controlled by a control logic stored in the read-only memory JROM 20 (located inside the digital signal processor core 101). This download is accomplished in a serial transfer manner by shifting one bit at a time.

| 0 | mwait = 0x0000 | /* set wait states to 0 */ |
| 2 | set r3 = 0x0 | /* register r3 is set to 0 */ |
| 3 | set r2 = 0x499 | /* register r2 is set to 0x499 */ |
| 4 | do 3 { | /* do loop with 2 instruction */ |
| 5 | y = *r3-- | /* read data from external memory */ |
|   | *r2++= y | /* store data in the program memory */ |
| 7 | goto 0x500 | /* jump to location 0 */ |

The JTAG controller 300 sequences downloading by using the control bits in the JCON 10 (the six bits mentioned above). JTAG controller 300 sets the JLOAD signal, this causes the JROM 20 to be mapped into the program space of the digital processor core 101. In other words, JROM 20 is enabled and the JROM 20 then takes over the control of the downloading of the executable code into the TDR 11, then JRESET is pulsed. This resets the digital processor core 101. The code is now ready to be transferred from TDR 11 to the program memory 105. The digital processor core 101 then sets a "DATA" pointer to the beginning of program memory 105. The JTAG controller selects the TDR 10 and shifts in a sixteen bit digital processor instruction. The JINT signal then goes high and a small portion of the code from TDR 11 is written into the program memory 105, and the JINT signal is cleared. The entire process is repeated again until the entire executable code has been downloaded. This download is accomplished in a parallel transfer manner by shifting 16 bits at a time.

The program includes a loop through instructions 4 and 5. When the code execution reaches the "do" of instruction 4, the first time it will write to location 0x499 in the program memory 105 the executable code for the instruction "mwait= 0x0000". The second time in the loop, it will write to location 0x500 the executable code for the instruction "set r2=0x0". The third time, it will write to location 0x501 the executable code for the instruction "redo 127". After three cycles through the "do loop", the code jumps to address 0X500 in the program memory 105 to continue execution.

The executable code comprises a plurality of control instructions. This executable code tells the digital signal core 101 that the test vectors should be downloaded from the external memory 200 to the program memory 105 (via the high speed EMI interface 103).

As thus described, the executable code is transferred from the TDR 11 to the program memory 105 via the digital processor core 101. The purpose of this executable code is to tell the digital processor code 101 that the actual test vectors are resident in external memory 200 and should be downloaded.

After the code is downloaded, the JRESET in JCON 10 is pulsed to reset the digital signal processor so that program execution starts from location zero of the program memory 105, (i.e., the beginning of the program that was just downloaded).

In a preferred embodiment, the downloading of test vectors includes reading the input test vectors from the external memory 200 through the EMI interface 103 and writing them to the program memory 105 starting at location zero. When the entire set of test vectors has been downloaded from the external memory 200 to the program memory 105 via the digital processor core 101, the JTAG driver 300 sets the JPRLOW bit in the JCON 10 to select the memory map where the program starts execution from program memory at location 0. To cause the downloaded test vector to start, the JTAG again pulses the JRESET signal.

In order to execute the downloaded test vectors in the program memory 105, the JTAG driver 300 resets the JLOAD signal in the JCON 10. This removes the JROM 20 from the instruction (control) space and maps the instruction port of the program memory 105 back in. The JTAG driver 300 sets the JPRLOW bit to select a program memory map where the program memory starts at location 0. It pulses the JRESET signal in the JCON 10 to reset the DSP core 101, and the execution of the downloaded test vectors begins.

When testing is completed the output test results are sent out on the JTAG TDO pin to be forwarded to JTAG controller 300 and compared to the expected response. TDR 11 facilitates the transmission of test results from the digital processor core 101 to the JTAG controller 300. First, digital processor core 101 writes the results to the TDR 11. This clears the PINT signal. The JTAG controller 300 polls the PINT signal until it sees that results have been written in the TDR 11. Then, PINT goes high and the JTAG controller 300 shifts out the results from the TDR 11. The digital processor core 101 may then write the next test result to the TDR 11 and the process continues unless all the results have been uploaded.

The test vectors are downloaded from the external memory 200 to the DSP device 100 at an increased speed. Only the executable code is downloaded via the slow JTAG interface. This provides a reduction in the testing time of integrated circuits. However, the present invention is not limited by the method of performing the download of the executable code. The present invention may be practiced by various ways of performing the download of the executable code. For example, the JROM 20 may be omitted and the TDR 11 may be directly connected to the program memory 105, and operate under the control of a direct memory access (DMA) controller. The JLOAD signal could then cause the DMA controller to transfer the program word by word from the TDR 11 to the program memory 105.

The program memory 105 stores the executable code as well as the actual test vectors (test programs). Instead of storing all the test results, the data stored in the program memory 105 is flushed after the completion of each testing, and the program memory 105 is reused to store the information in the next iteration of testing. Although a dual port program memory 105 is preferred, it is not required.

Having described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

We claim:

1. A method for testing integrated circuits by using a plurality of test vectors, said integrated circuit comprising a programmable digital processor device and an internal memory, said integrated circuit coupled to an external memory via a parallel interface, said external memory storing said test vectors, said method comprising;

downloading a control program through a joint test action group (JTAG) interface to said internal memory;

downloading said test vectors from said external memory to said digital processor device via said parallel interface; and testing said integrated circuit by using said test vectors.

2. The method of claim 1 further comprising:

controlling said download of said test vectors by said control program stored in said internal memory.

3. The method of claim 1 said method further comprising:

resetting said integrated circuit to an initial state prior to initiating testing of said integrated circuit.

4. The method of claim 1 wherein said method of downloading a control program comprises the steps of:

receiving said control program through a serial test input part; and transferring said control program in parallel to said internal memory.

5. The method of claim 1 further comprising the steps of:

transferring test results of said test vector to an external device.

6. The method of claim 5 wherein said test results are transferred to said external device in a serial transfer manner.

7. An integrated circuit comprising:

a programmable digital processor core;

a parallel interface bus for interfacing between said processor core and an external memory storing a plurality of test vectors to be used for testing the operation of said integrated circuit;

a program memory coupled to said processor core; and a joint test action group (JTAG) block coupled to said processor core for coupling to an external JTAG driver having been programmed to selectively download a program to said program memory to control downloading of said test vectors from said external memory through said parallel interface.

8. The integrated circuit of claim 7, wherein said JTAG driver further comprises:

a test data register (TDR) having a serial test input port and having n-bit locations for serially receiving a control program through said serial test input port, and for transferring said control program in parallel into said program memory via said digital processor;

a test control register (JCON) for initiating downloading and execution of said control program in order to download said test vectors and produce test results; and wherein the test results of said test vectors are transferred via said programmable digital processor into said test data register for serial transfer through said serial test output port.

9. The integrated circuit of claim 8 wherein said test control register includes a control bit for clocking said programmable digital processor from a system clock signal supplied from a source external to said integrated circuit.

10. The integrated circuit of claim 8 wherein said test control register includes a control bit for clocking said digital processor from a signal supplied from a test clock external to said integrated circuit.

11. The integrated circuit of claim 8 wherein said test control register includes a control bit for resetting said programmable digital processor to an initial state.

12. The integrated circuit of claim 8 further comprising a read only memory, and wherein said test control register includes a control bit for mapping said read only memory into the address space of said program memory, wherein said read only memory controls downloading said test program into said program memory.

13. The integrated circuit of claim 8 wherein said integrated circuit register includes instructions for:
   selecting said test control register for a serial write operation;
   selecting said test control register for a serial read operation;
   selecting said test data register for a serial write operation; and
   selecting said test data register for a serial read operation.

14. The integrated circuit of claim 8 wherein said test control register includes a control bit for enabling block downloading of said executable code into said test data register, wherein said test vectors are received as a continuous sequence of data words after receiving an initial sequence of a given bit pattern.

15. The integrated circuit of claim 7 wherein said program memory is a dual-port memory having a first port that is accessed by a data bus, and a second port that is accessed by a program instruction bus.

16. The integrated circuit of claim 7 wherein said parallel interface bus is an external memory interface and is connected to said programmable digital processor by a 16 bit bus.

17. The integrated circuit of claim 7 wherein said executable instructions are downloaded to said program memory from an external device.

18. The integrated circuit of claim 7 further comprising:
   a first status flag means (JINT) connected to said programmable digital processor that is set when said programmable digital processor writes a word, and is reset when said programmable digital processor reads a word; and
   a second status flag means (PINT) connected to said programmable digital processor that is set when said programmable digital processor reads a word, and is reset when said programmable digital processor reads a word, and is reset when said programmable digital processor writes a word.

19. The integrated circuit of claim 18 wherein said first status flag means (JINT) and said second status flag means (PINT) are implemented by means of register bits in said test control register (JCON).

* * * * *